United States Patent [19]

Thomas et al.

[11] Patent Number: 4,746,621
[45] Date of Patent: May 24, 1988

[54] PLANAR TUNGSTEN INTERCONNECT

[75] Inventors: David C. Thomas, Wilkes-Barre, Pa.; S. Simon Wong, Ithaca, N.Y.

[73] Assignee: Cornell Research Foundation, Inc., Ithaca, N.Y.

[21] Appl. No.: 938,498

[22] Filed: Dec. 5, 1986

[51] Int. Cl.[4] .................... H01L 21/425; H01L 21/443
[52] U.S. Cl. ......................................... 437/24; 437/37; 437/195; 437/200
[58] Field of Search ...................... 437/203, 24, 37, 38, 437/200, 195; 148/DIG. 140

[56] References Cited

U.S. PATENT DOCUMENTS

| | | | |
|---|---|---|---|
| 4,307,179 | 12/1981 | Chang et al. | 156/643 |
| 4,347,264 | 8/1982 | Lindmayer | 156/648 X |
| 4,351,892 | 9/1982 | Davis | 156/653 X |
| 4,378,383 | 3/1983 | Moritz | 156/643 X |
| 4,396,458 | 8/1983 | Platter et al. | 156/643 |
| 4,531,144 | 7/1985 | Holmberg | 357/71 |
| 4,556,628 | 12/1985 | Greschner et al. | 156/643 X |
| 4,581,098 | 4/1986 | Gregor | 156/635 |

OTHER PUBLICATIONS

Wilson et al., "Highly Selective, High Rate Tungsten Deposition", Materials Research Soc. 1985 Workshop, pp. 35–42.

Moriya et al., IEDM (1983), pp. 550–553.
Barton et al., Semiconductor International (Jan. 1985), pp. 98–102.

*Primary Examiner*—Olik Chaudhuri
*Attorney, Agent, or Firm*—Jones, Tullar & Cooper

[57] ABSTRACT

A planar interconnect using selective deposition of a refractory metal such as tungsten into oxide channels is disclosed. A layer of silicon dioxide as thick as the desired tungsten interconnect is placed on the surface of a substrate such as an integrated circuit wafer. Thereafter, a layer of silicon nitride about 100 nm thick is formed on the silicon dioxide. Channels are formed in the silicon dioxide by patterning and etching the composite dielectric layers. After the photoresist is removed, silicon or tungsten atoms at 40 KeV are implanted in the silicon dioxide channels, the silicon nitride acting as a mask. Typically, a dosage as high as $1 \times 10^{17} cm^{-2}$ is used. The silicon or tungsten implant allows seeding of the tungsten or other refractory metal. The silicon nitride mask is selectively removed by a hot phosphoric acid solution, and a metal film is then selectively deposited to fill the channels in the silicon dioxide layer, which then forms a level of interconnects. The process is repeated to form vias and subsequent levels of interconnects.

11 Claims, 2 Drawing Sheets

PLANAR TUNGSTEN INTERCONNECT

BACKGROUND OF THE INVENTION

The present invention relates, in general, to very large scale integration (VLSI) technology, and more particularly to a method of forming improved interconnections in VLSI devices.

The fabrication of integrated circuits is based on materials, processes, and design principles which constitute a highly developed technology, and which are well known in the industry. Monolithic circuits are the most fundamental form, wherein the entire circuit, including active and passive components, is formed in a monolithic body of semiconductor material. In another form, thin- or thick-film circuits are fabricated by depositing conductive or resistive films on an insulating substrate, and by imposing patterns on them to form an electrical network. Hybrids form a natural extension of the first two types, and contain passive and active devices, as well as monolithic integrated circuits assembled and interconnected on an insulating ceramic substrate common to all. Such circuits have application not only in linear devices such as amplifiers, but also in digital devices such as logic circuits and memories. More recently, integrated circuits have found application in microwave circuits, operating at extremely high frequencies, on the order of 15 GHz, and such applications rely heavily on hybrid circuit technology.

Techniques utilizing VLSI technology provide a large number of components, on the order of 10,000 individual circuit components, on a single integrated circuit chip, the components being interconnected to form complete systems or subsystems. The electrical interconnection of these integrated components is achieved, for example, by the evaporation of highly conductive thin films onto a silicon dioxide insulating layer formed on the integrated circuit. The most often used material for this purpose is aluminum, because of its high electrical conductivity and good adherence to the silicon dioxide surface. Resistive thin films such as tantalum, nickel-chromium alloys, and tin oxide are commonly used to form resistor patterns.

A variety of deposition techniques are available for forming thin-film layers on a dielectric substrate. Thus, vacuum evaporation is commonly used to deposit aluminum, gold, or silver conductive films. Cathode sputtering, vapor phase deposition, plating techniques, and anodization processes are also well known. The basic photomasking and etching techniques have been commonly utilized in patterning thin-film components, except that where multiple thin-film layers are produced, care must be taken in the choice of an etchant to make sure that the bottom film is not damaged by the patterning of the top layer. Furthermore, since photoresist is an organic polymer, it cannot withstand exposure to high temperatures, so that the deposition of some materials, which require high temperatures, is limited.

The basic requirement for the conductive films used for interconnections is that they should make good ohmic contact with the diffused components or other metallic films deposited on the device surface. The exposure of contact areas to ambient atmosphere often results in the formation of parasitic oxide layers over the chip area to be interconnected. Therefore, to provide good ohmic contact, the interconnecting metal must be chemically active so that it can be alloyed or sintered through these parasitic layers. As noted above, the most commonly used interconnection metal is aluminum, which can be readily alloyed into the silicon substrate, to form ohmic contacts.

If the required interconnection cannot be accomplished in one plane, different methods of producing crossovers are available, but when very high packing densities of devices are required, or if stray capacitances must be minimized, multi-layer metallization can be used. Such metallization involves depositing alternate layers of patterned interconnections separated by dielectric layers, and care must be taken to select materials that will have sufficient dielectric strength, volume resistivity, and thermal and mechanical stability to withstand the processing operations used to form the interconnections. Most multi-layer metal processes use aluminum as the interconnection metal. The multiple interconnection layers are themselves interconnected by way of via holes cut in the separating dielectric layer.

The reliability of interconnections is a serious problem in VLSI microcircuits, however, and particularly in submicron circuits, such as those designed for microwave frequencies, where the pitch of adjacent interconnection lines might be about 2 microns. This is due, in large part, to electromigration effects at high current densities.

Electromigration is a mass-transport effect which causes the atoms of the interconnection metal to migrate gradually toward the more positive end of the conductor. This phenomenon takes place along the grain boundaries of the metal interconnections, and results in the formation of voids in the interconnection pattern which may eventually lead to an open circuit. Such electromigration is enhanced at elevated temperatures. In addition, in the case of aluminum interconnections, chemical reactions between silicon or silicon dioxide and the aluminum layer can also result in breaks in the conductive interconnection pattern.

In addition to the foregoing problems, prior methods of providing interconnects often result in the need to pattern and etch metal films. This process is undesirable in submicron circuits, for the patterning and etching of deposited metal results in a non-planar surface, and thus makes multi-level interconnection difficult and expensive, since replanarization becomes necessary after each level. Because each such process step tends to reduce the yield of the process, the complexity of prior systems, as a practical matter, often limits such connections to two layers. Although conventional lift-off procedures can solve some of these problems in some circuits, it is next to impossible to fabricate a submicron metal line using such procedures.

SUMMARY OF THE INVENTION

It is an object of the present invention to produce submicron circuit interconnects wherein the structure remains planar after each level of metallization.

It is another object of the invention to provide an interconnect of two or more levels, wherein the interconnect lines have submicron pitches.

It is a further object of the invention to provide, for VLSI circuits, an interconnect structure which provides a high resistance to electromigration.

Briefly, the present invention is directed to a planar interconnect technique based on the selective deposition of a refractive metal such as tungsten. The conventional approach to metallization, by depositing, patterning, and etching a metal layer, usually requires a large number of elaborate replanarization process steps to be performed on the wafer surface to restore a planar surface onto which a next layer can be placed. The present invention avoids this by selectively depositing tungsten (W) into oxide channels. This not only reduces the number of steps, but also produces a planar surface after each level of metallization, thereby facilitating multilevel interconnections. The tungsten interconnect material also produces a high resistance to electromigration, so that the metal pitch, which is the width of the metal line plus the width of the space to the next adjacent metal line, can be substantially reduced, with the result that submicron pitches can be produced.

As the features of circuit devices continue to decrease in size as the technology of microcircuits advances, so must the metal pitch of their interconnect lines. The minimum metal pitch of currently-used aluminum lines is approximately 4 microns, and there is some evidence that this may be a fundamental limit, since further reduction leads to serious electromigration problems. Some attempts have been made to solve this problem by making the aluminum lines thicker, but this only makes replanarization more difficult. The use of tungsten in such interconnect lines permits a reduction of the metal pitch to less than 1 micron without significant electromigration. Further, the process of the present invention produces interconnect levels with planar surfaces, thereby avoiding the need for replanarization and permitting multiple layer interconnects.

In accordance with the invention, after completion of the circuit chip or other device, an electrically insulating silicon dioxide ($SiO_2$) layer is deposited on the surface of the chip or other device to a thickness greater than the desired thickness of the tungsten interconnect line. The silicon dioxide layer is then planarized, in known manner (see "A Two-level Metal C-MOS Process for VLSI Circuits", *Semiconductor International*, January 1985, Don Barton and Craig Maze, pp. 98–102) to provide an upper planar surface, and leaving an oxide layer having a thickness at least as great as the desired thickness of the metal interconnect line. A thinner silicon nitride ($Si_3N_4$) mask layer, preferably about 100 nm thick, is then deposited on the $SiO_2$ layer. Channels for the tungsten interconnects are then formed in the silicon dioxide layer by photoresist patterning and etching techniques. Silicon or tungsten is implanted on the mask layer and in the channels, and the silicon nitride mask is removed, together with its implanted silicon or tungsten. Thereafter, a refractory metal such as tungsten is selectively deposited by chemical vapor deposition in the channels. The metal seeds on the implanted layer, but not on the oxide, grows in the channels, completely filling them and leaving a planar surface onto which another layer of $SiO_2$ can be placed to receive a second layer of vias and/or interconnects. The process of forming channels and implanting silicon or metal in the bottom of the channels to facilitate the deposition of the metal lines, and the filling of the channels with metal is repeated to form as many levels of interconnects as may be required, with each layer having a planar top surface to facilitate formation of additional layers without the need to carry out complex replanarization steps.

The use of silicon or tungsten in the interconnect channels allows the tungsten or other desired refractory metal to be selectively deposited in the channels, for with careful control of the deposition conditions, tungsten will deposit on silicon or metal, but will not deposit on oxide or nitride dielectrics. Thus, for channels which do not pass completely through the dielectric layer, the silicon deposit insures adhesion of the tungsten lines in the channel. If the channel passes completely through the dielectric layer to allow the tungsten line to contact an underlying metal contact point on the VLSI circuit or to contact an interconnect line on an adjacent interconnect level, the silicon implantation occurs in the exposed surface of the next lower interconnect level to insure adhesion of the metal line. This implantation insures proper adhesion of the metal line or via even if its channel is slightly misaligned with the underlying metal.

The foregoing process of depositing the metal lines in oxide channels also avoids the need to provide photoresist masking for the deposition. This makes the silicon implantation and the use of refractory metal possible, since heating problems arise when attempts are made to implant silicon or deposit tungsten through a photoresist mask. The high energy implantation causes photoresist material to harden and become very difficult to remove, while the deposition causes the photoresist material to flow, and these problems have precluded the use of materials such as tungsten in the formation of submicron interconnect lines. The process of the present invention allows tungsten or other refractory metals to be used, and thereby solves the problem of electromigration to allow a significant reduction in the metal pitch of adjacent lines.

Accordingly, the foregoing structure and process has numerous desirable features. First, patterning and etching of a metal layer are no longer required. Second, the wafer surface is completely planar after each level of interconnect or via formation. Further, the refractory metal used for the interconnect lines adheres well to the Si-implanted $SiO_2$, and the resulting line exhibits an acceptable resistivity. Thus, the process and structure of the present invention overcomes the problems encountered in the prior art.

BRIEF DESCRIPTION OF THE DRAWINGS

The foregoing, and additional objects, features and advantages of the present invention will become apparent to those of skill in the art from a consideration of the following detailed description of a preferred embodiment thereof, taken with the accompanying drawings, in which.

DESCRIPTION OF PREFERRED EMBODIMENT

Figure 1:
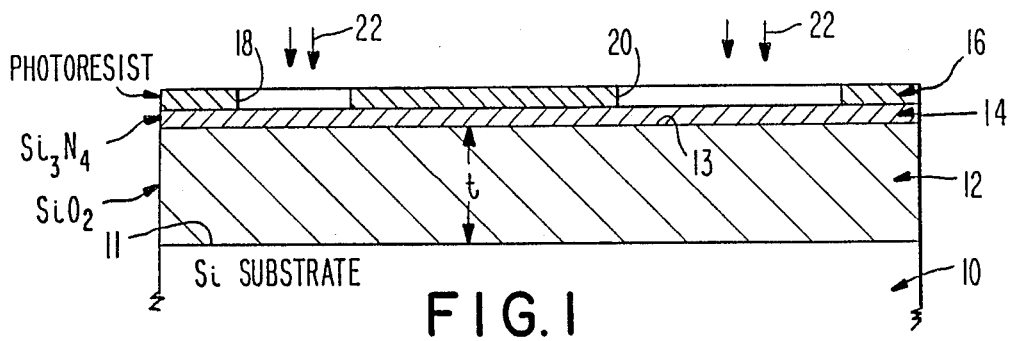
FIGS. 1–6 illustrate, in sectional views, the fabrication technique of the planar tungsten interconnect of the present invention.

Turning now to a more detailed consideration of the present invention, FIGS. 1–6 illustrate a process of forming a single level of metallization for providing tungsten interconnect lines, the lines being formed by the selective deposition of a refractory metal such as tungsten into implanted oxide channels. This interconnect technology is illustrated in the several figures as producing an interconnect level on a substrate 10, which may be a silicon wafer wherein the wafer carries a large number of VLSI components which are to be interconnected by conductive lines, or interconnects. As illustrated in FIG. 1, the substrate 10 has a nonplanar surface 11 which incorporates the circuit devices (not shown) carried on the wafer, and onto which a layer 12 of silicon dioxide is deposited, as by low pressure chemical vapor deposition (LPCVD). The layer 12 is deposited to be slightly thicker than the desired thickness of the tungsten interconnect lines to be deposited and then is planarized down to desired thickness to provide a planar top surface. The layer 12 is shown as having a thickness t, and a planar top surface 13. Thereafter, a layer 14 of silicon nitride ($Si_3N_4$) is deposited on the top of the silicon dioxide layer. Preferably, the silicon nitride layer 14 is approximately 100 nm thick. Layer 14 acts as a mask for an implantation which is to be performed in a later step.

A photoresist layer 16 is spun onto the top surface of layer 14 and is exposed and developed in conventional manner to define apertures such as 18 and 20 which define areas of removal for layers 12 and 14 in a subsequent etching step. The photoresist layer 16 acts as a mask for the etching step, which may take place in a reactive ion etcher, the etching step being illustrated diagrammatically by the arrows 22.

Figure 2:
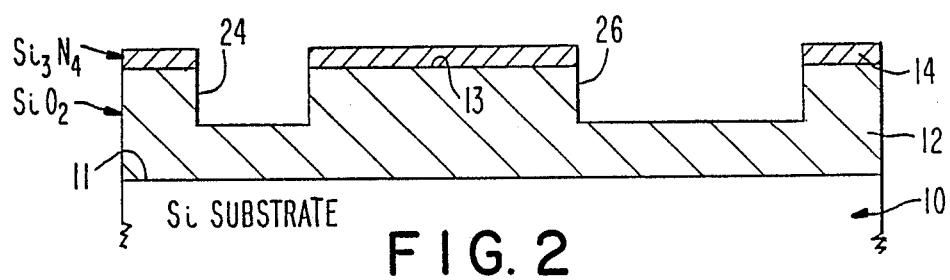

After the etching is complete and the photoresist mask layer 16 is removed, as illustrated in FIG. 2, interconnect channels 24 and 26, for example, remain in the layers 12 and 14. As illustrated, the channels are formed through the layer 14 and partially into the layer 12, the channels in layer 12 being formed to the depth desired for the thickness of the tungsten interconnect lines. Although the channels 24 and 26 are shown as being one-half the depth of the layer 12, this is for purposes of illustration and other depths may be selected. For example, it is contemplated that at some locations, where contact is to be made between the interconnect lines and contact points or lines on the underlying substrate 10, the channels would be formed completely through the layer 12 to form "via" holes.

Figure 3:
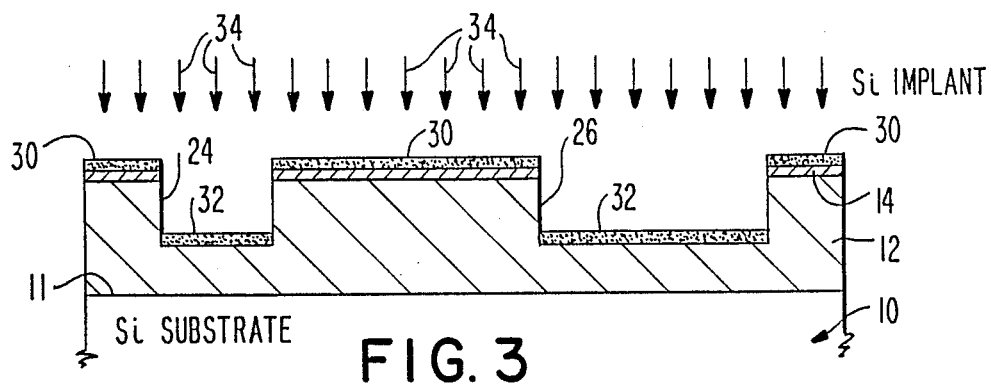
Figure 4:
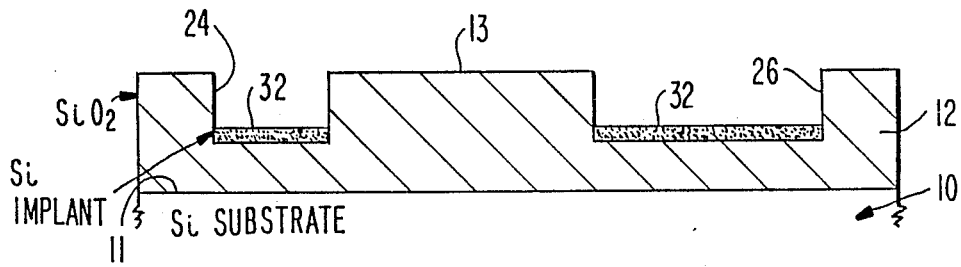

As illustrated in FIG. 3, after the photoresist is removed, silicon atoms are implanted in the exposed surfaces of the silicon dioxide layer 12 and the silicon nitride layer 14, to form a silicon implantation layer 30 in the top portion of layer 14 and to form a silicon implantation layer 32 in the exposed surface of layer 12 at the bottom of channels 24 and 26. The silicon atoms are implanted, as indicated by arrows 34, preferably at an energy of 40 KeV at a dosage sufficient to initiate seeding of tungsten in the subsequent deposition step; for example, about $1 \times 10^{17}$ per square centimeter. This implantation "seeds", or initiates, the deposition of tungsten on the silicon dioxide layer 12. Since a photoresist mask cannot be used to limit the implantation because of potential heating problems in the photoresist material, the silicon nitride layer 14 serves as the mask.

After implantation of the silicon, the silicon nitride layer 14 is selectively removed in a hot phosphoric acid ($H_3PO_4$) solution, taking with it the silicon implantation at 30. The etching rate of the silicon nitride is not affected by the silicon implant, and by selectively removing only layer 14, together with the implanted layer 30, the configuration of FIG. 4 remains, with the surface 13 remaining planar except for the presence of channels 24 and 26.

Figure 5:
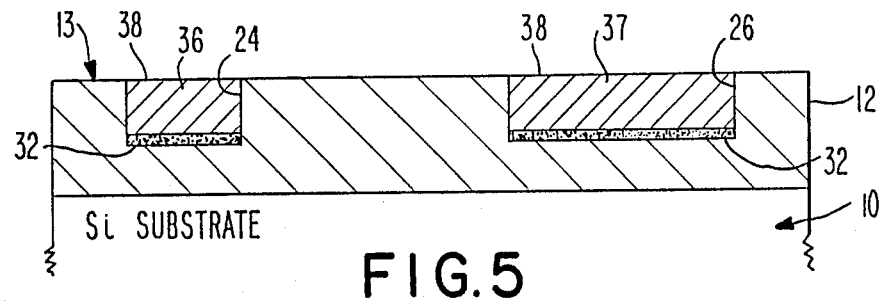
Figure 6:
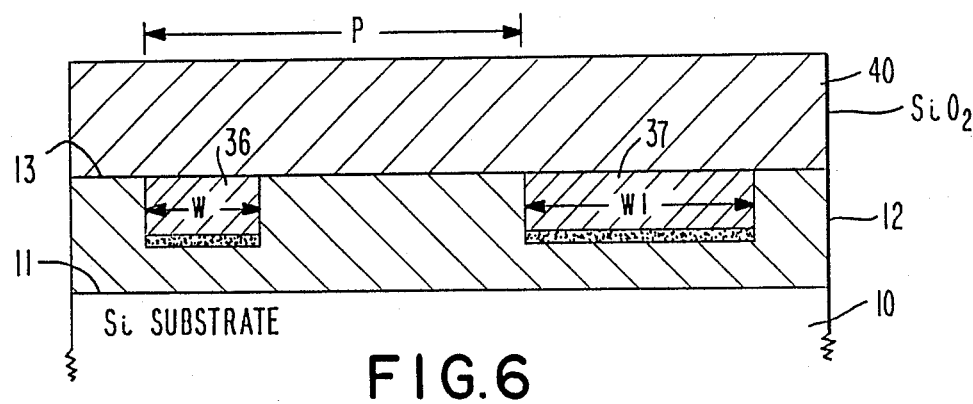

After removal of layer 14 and the implanted silicon layer 30, a tungsten film is selectively deposited, as indicated at 36 and 37 in FIG. 5, to fill the channels 24 and 26, respectively. As indicated above, the silicon layer 32 at the bottom of channels 24 and 26 facilitates the deposition of the tungsten and insures good adhesion of the tungsten material. The deposition is selective, since tungsten does not adhere well to dielectric oxides, and thus will not adhere to the top surface 13 of the layer 12. The tungsten fills the channels completely to provide planar top surfaces 38 which are level with the planar top surface 13 of layer 12, so that the entire interconnect region has a planar top surface to thereby facilitate the formation of subsequent layers of interconnects without the need for the complex replanarization steps that were required in prior processes of forming interconnect levels. The layer 12 with its tungsten interconnect lines 36 and 37 then becomes a first level of interconnect for the integrated circuits carried by the wafer 10. As indicated in FIG. 6, a second layer 40 of silicon dioxide can be formed on the planar surface 13 to produce a second layer of interconnects or vias by following the process outlined with respect to FIGS. 1–5, as will be further discussed below with respect to FIG. 7.

The lines 36 and 37 preferably are submicron interconnect lines, having a width w or w1 of less than a micron. Further, in the preferred implementation of the invention, wherein the VLSI circuits are used for extremely high frequency circuits, the metal pitch P (FIG. 6), which is the width of the metal line plus the space to the adjacent line, is less than about 2 microns, and preferably is less than 1 micron. Although FIGS. 1–6 show the lines 36 and 37 extending only partially through the layer 12, it may be desirable to extend some of the lines, or parts of the lines, completely through the layer for connection with underlying metal components or contacts. Such through contacts, or vias, provide connections between interconnect levels.

Figure 7:
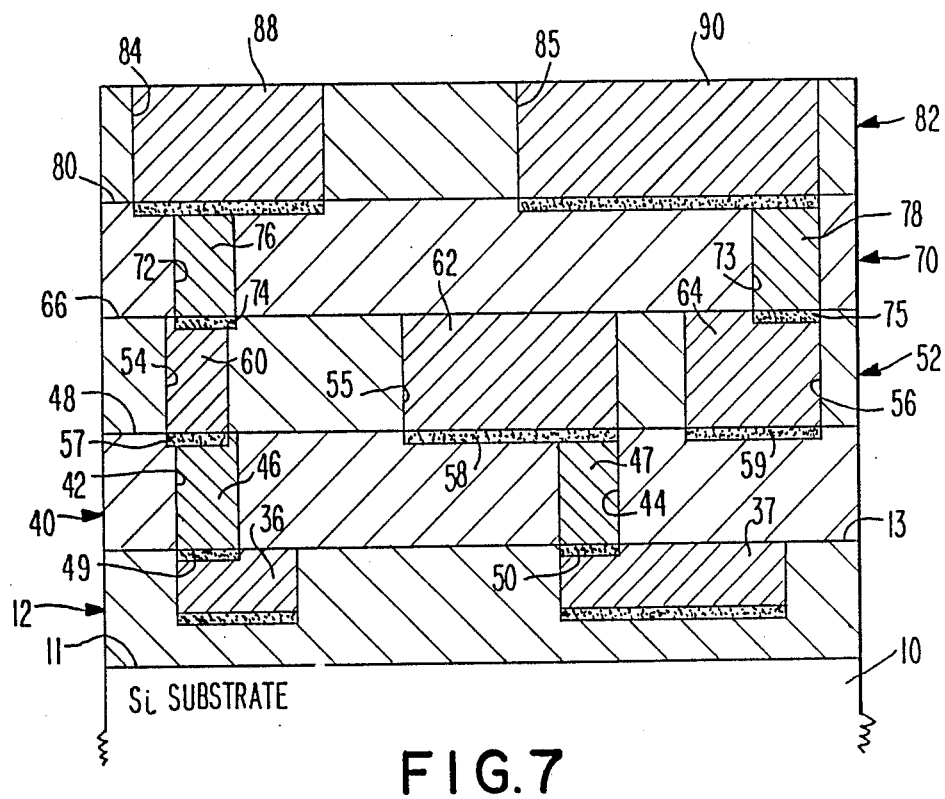
FIG. 7 is a sectional view of a multilayer interconnect, formed by the process of FIGS. 1–6.

FIG. 7 illustrates a multilayer interconnect wherein the first layer 12 is formed in accordance with the illustration of FIG. 5. Thereafter the second layer 40 is subjected to the process of FIGS. 1–5 to produce a pair of via channels 42 and 44 extending completely through layer 40. These via channels are in the form of holes or apertures which are filled with tungsten to form interconnects 46 and 47 to contact the tungsten lines 36 and 37 in layer 12. The tungsten material completely fills the via channels 42 and 44 to form the vias 46 and 47 to produce a planar top surface 48 on layer 40.

Before the tungsten is deposited in the channels 42 and 44, silicon implantation step (FIG. 3) is performed, to produce silicon implants 49 and 50 in the portions of surface 13 exposed through the channels. These implants insure proper adhesion between the deposited tungsten and the underlying surface. The illustrated layer 40 incorporates only via holes, and is referred to as a via level, rather than an interconnect level.

A third layer 52 similarly is formed with channels 54, 55 and 56 all shown as extending completely through layer 52. At the bottom of the channels are implants 57, 58 and 59, respectively, formed by the implantation of silicon in the manner explained above. The implants are formed on the exposed portions of surface 48 to facilitate the adhesion of the tungsten which fills the channels to form via 60 and interconnect lines 62 and 64. Via 60 is shown as being slightly offset from the underlying via 46 to illustrate how the present invention overcomes the problem of misalignment in forming the levels of interconnects.

In prior devices, it was necessary to make an overlying connector about twice as large in area as an underlying connector in order to insure proper electrical contact between them. The present invention avoids this, and compensates for misalignments by implanting silicon (or tungsten) in the top surface of the underlying level. If there is any overlap at all between the channel and the underlying contact, the silicon implant will insure a good electrical connection and will at the same time insure proper adhesion of the tungsten to the underlying surface. Thus, as shown in FIG. 7, the implant 57 is offset from the underlying tungsten via 46, but insures a proper connection between via 46 and via 60.

The via 60 and lines 62 and 64 are completely filled with tungsten to form a planar surface 66, on which a fourth interconnect layer of silicon dioxide 70 can be formed. As illustrated, layer 70 includes a pair of channels 72 and 73, at the bottom of which are implants 74 and 75 in the surface 66. The channels are filled with tungsten to form vias 76 and 78 and a top planar surface 80. A fifth layer 82 of silicon dioxide can be formed on the planar surface 80 and channels 84 and 85 formed therein. Implants 86 and 87 are formed on surface 80, and the channels are filled with tungsten to produce interconnect lines 88 and 90. In this manner, multiple interconnect levels 12, 52 and 82 are formed on the surface of wafer 10 with intermediate via layers 40 and 70 to provide complex interconnections to the circuits carried on the substrate.

The foregoing tungsten interconnect technology has numerous desirable features. First, patterning and etching of a metal layer are no longer required. The surface 13 on wafer 10 is initially made planar, and the wafer surface remains planar after each successive level of interconnect or via formation, as shown in FIGS. 5, 6 and 7. Thus, only an initial planarization before formation of the first metal layer is required for multi-level interconnects. The adhesion of the tungsten to the silicon implanted silicon dioxide has been found to be very good. Further, the tungsten interconnects have been found to exhibit a resistivity of about 7 micro ohms per centimeter, which is similar to the bulk resistivity of the material, and a low contact resistivity between tungsten levels has also been achieved. Furthermore, because of the high resistance to electromigration of the tungsten material, the spacing between adjacent lines, such as the lines 36 and 37 in FIG. 6, can be significantly reduced below that which is possible with aluminum interconnect lines, and more particularly allows a spacing between lines sufficiently small to provide sub-micron metal pitches. Accordingly, the present invention provides an improved interconnect technology for VLSI microcircuits, and particularly for such circuits used in extremely high frequency microwave applications.

Although the invention has been described in terms of silicon implants it has been found that other metal implants such as tungsten will also provide the required function. Further, other refractory metals may be used in place of tungsten to provide the desired interconnect lines. The metal lines may be on the order of 1 micron thick and less than 1 micron in width to provide the desired conductivity, while allowing a pitch of less than 1 micron. The thickness of the lines can be adjusted, without adversely affecting the planar surfaces.

Although the present invention has been described in terms of a preferred embodiment, it will be apparent that variations and modifications may be made without departing from the true spirit and scope thereof as set forth in the following claims.

What is claimed is:

1. A method of forming an interconnect level for VLSI devices, comprising:
   forming on a planar surface of a VLSI wafer a first silicon dioxide dielectric layer, said first layer having a planar top surface;
   forming a second layer of a second dielectric material on said top surface of said first layer to produce a composite dielectric;
   patterning and etching said composite dielectric to produce at least one interconnect channel in said first layer, said channel extending through said second layer, whereby said second layer forms a mask for said channel in said first layer;
   implanting silicon in the exposed bottom surface of said silicon dioxide interconnect channel through said mask;
   removing said mask;
   selectively depositing a refractory metal in said interconnect channel to fill said channel to the level of said planar top surface of said first layer to thereby form a metal interconnect line, said line and said first layer forming a first planar interconnect level.

2. The method of claim 1, wherein the step of patterning and etching produces plural interconnect channels.

3. The method of claim 2, wherein the deposition of said refractory metal fills said plural interconnect channels to form plural interconnect lines.

4. The method of claim 3, wherein said plural interconnect channels are so positioned that adjacent lines of said plural interconnect lines having a metal pitch of less than about two microns, said interconnect lines having a high resistance to electromigration.

5. The method of claim 1, wherein said first layer is formed by low pressure chemical vapor deposition of silicon dioxide on said wafer, said first layer having a thickness equal to or slightly greater than the thickness of said interconnect line.

6. The method of claim 5, wherein said second layer is formed by the deposition of silicon nitride on the top surface of said first layer to a thickness of about 100 nm.

7. The method of claim 6, wherein said composite dielectric is etched in a reactive ion etcher to form said at least one interconnect channel.

8. The method of claim 6, wherein said silicon is implanted at an energy of about 40 KeV to produce a silicon dosage of about $1 \times 10^{17}$ cm$^{-2}$ in the bottom of said at least one channel.

9. The method of claim 1, further including depositing a third silicon dioxide dielectric layer on the top surface of said first planar interconnect level and forming therein at least one metal-filled via hole to produce a second planar interconnect level.

10. The method of claim 9, wherein the step of forming a via in said third dielectric layer comprises:
    forming on the top surface of said third layer a fourth layer of said second dielectric material to form a second composite dielectric;
    patterning and etching said second composite dielectric to produce at least one channel in said third and fourth layers to expose the top surface of said first interconnect level;
    removing said fourth layer;
    implanting silicon in the exposed surface of said first interconnect level through said channel in said third layer; and
    selectively depositing a refractory metal to completely fill said channel in said third layer to form a connector and to produce a second planar interconnect level.

11. The method of claim 10, further including forming additional planar interconnect levels having interconnect lines and vias for said VLSI device.

* * * * *